(12) United States Patent
Hirosawa et al.

(10) Patent No.: US 11,471,991 B2
(45) Date of Patent: Oct. 18, 2022

(54) METHOD OF PROCESSING WORKPIECE

(71) Applicant: DISCO CORPORATION, Tokyo (JP)

(72) Inventors: Shunichiro Hirosawa, Tokyo (JP);
Shuzo Mitani, Tokyo (JP); Yuya Matsuoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 297 days.

(21) Appl. No.: 16/743,269

(22) Filed: Jan. 15, 2020

(65) Prior Publication Data
US 2020/0230773 A1     Jul. 23, 2020

(30) Foreign Application Priority Data
Jan. 17, 2019   (JP) .............................. JP2019-005776

(51) Int. Cl.
| | |
|---|---|
| *B24B 1/00* | (2006.01) |
| *B24B 7/22* | (2006.01) |
| *B24B 57/02* | (2006.01) |
| *H01L 21/304* | (2006.01) |

(52) U.S. Cl.
CPC ............... *B24B 7/22* (2013.01); *B24B 57/02* (2013.01); *H01L 21/304* (2013.01)

(58) Field of Classification Search
CPC .......... B24B 7/22; B24B 57/02; H01L 21/304
USPC ...................................... 451/41, 57, 65, 288
See application file for complete search history.

(56) References Cited

U.S. PATENT DOCUMENTS

| | | | |
|---|---|---|---|
| 7,022,000 B2* | 4/2006 | Mizomoto | B24B 7/228 451/288 |
| 7,981,770 B2* | 7/2011 | Kaneko | B23K 26/53 438/463 |
| 2017/0278759 A1* | 9/2017 | Sukegawa | G01N 22/02 |
| 2018/0099377 A1* | 4/2018 | Sekiya | B24D 7/16 |

FOREIGN PATENT DOCUMENTS

JP    2011101913 A    5/2011

* cited by examiner

*Primary Examiner* — Joseph J Hail
*Assistant Examiner* — Shantese L Mcdonald
(74) *Attorney, Agent, or Firm* — Greer Burns & Crain, Ltd.

(57) ABSTRACT

A method of processing a plate-shaped workpiece is provided. The method includes the steps of sticking a protective member to a face side of the workpiece, holding the face side of the workpiece on a holding surface of a chuck table with the protective member interposed therebetween, grinding a reverse side of the workpiece held on the chuck table to thin the workpiece by rotating a grinding wheel including grinding stones that contain abrasive grains, while a grinding fluid is being supplied from a grinding fluid supply nozzle to the reverse side of the workpiece, and after the step of grinding the reverse side of the workpiece, treating the workpiece or the grinding stones by rotating the grinding wheel and bringing the grinding stones into contact with the reverse side of the workpiece, while stopping supplying the grinding fluid from the grinding fluid supply nozzle.

18 Claims, 4 Drawing Sheets

METHOD OF PROCESSING WORKPIECE

BACKGROUND OF THE INVENTION

Field of the Invention

The present invention relates to a method of processing a plate-shaped workpiece.

Description of the Related Art

Recent years have seen a growing number of occasions for processing plate-shaped workpieces typified by semiconductor wafers into thinner workpieces by grinding in order to realize small, lightweight device chips fabricated from those workpieces. When a surface of a plate-shaped workpiece is ground, the surface is crushed by grinding stones and the ground surface tends to remain crushed.

The plate-shaped workpiece whose ground surface remains crushed has its flexural strength lowered. Therefore, it has been customary to polish the ground surface of the workpiece by chemical mechanical polishing (CMP) or the like to eliminate the crushed state of the ground surface (see, for example, Japanese Patent Laid-Open No. 2011-101913).

SUMMARY OF THE INVENTION

However, a polishing process such as CMP performed on a workpiece after the workpiece has been ground is likely to incur a high processing cost though it is effective to increase the flexural strength of the workpiece. Consequently, there have been demands for a new efficient method of processing a workpiece without suffering an increased processing cost.

It is therefore an object of the present invention to provide a new efficient method of processing a workpiece.

In accordance with an aspect of the present invention, there is provided a method of processing a plate-shaped workpiece, including the steps of sticking a protective member to a face side of the workpiece, holding the face side of the workpiece on a holding surface of a chuck table with the protective member interposed therebetween, such that a reverse side of the workpiece which is opposite the face side thereof is exposed, grinding the reverse side of the workpiece held on the chuck table to thin the workpiece by rotating a grinding wheel including grinding stones that contain abrasive grains and bringing the grinding stones into contact with the reverse side of the workpiece, while a grinding fluid is being supplied from a grinding fluid supply nozzle to the reverse side of the workpiece, and after the step of grinding the reverse side of the workpiece, treating the workpiece or the grinding stones by rotating the grinding wheel and bringing the grinding stones into contact with the reverse side of the workpiece, while stopping supplying the grinding fluid from the grinding fluid supply nozzle.

According to the aspect of the present invention, a planarity of the reverse side of the workpiece may be increased in the step of treating the workpiece or the grinding stones.

According to the aspect of the present invention, a performance of the grinding stones may be recovered in the step of treating the workpiece or the grinding stones.

According to the aspect of the present invention, the method should preferably further include the step of, before the step of grinding the reverse side of the workpiece, roughly grinding the reverse side of the workpiece using rough grinding stones containing abrasive grains larger than the abrasive grains contained in the grinding stones.

In the method of processing a plate-shaped workpiece according to the aspect of the present invention, the step of grinding the reverse side of the workpiece while supplying the grinding fluid thereto is followed by the step of treating the workpiece or the grinding stones by bringing the grinding stones into contact with the reverse side of the workpiece, while stopping supplying the grinding fluid. In the step of treating the workpiece or the grinding stones, since the grinding stones are brought into contact with the reverse side of the workpiece, while stopping supplying the grinding fluid, the workpiece or the grinding stones are treated under conditions different from those of the step of grinding the reverse side of the workpiece.

For example, the planarity of the reverse side of the workpiece may be made higher in the step of treating the workpiece or the grinding stones than in the step of grinding the reverse side of the workpiece. For example, the performance of the grinding stones that has been lowered in the step of grinding the reverse side of the workpiece may be recovered in the step of treating the workpiece or the grinding stones. In the method of processing a plate-shaped workpiece according to the aspect of the present invention, the workpiece can be processed efficiently because the workpiece is treated in a manner different from the manner in which it is ground, simply by bringing the grinding stones into contact with the reverse side of the workpiece, while stopping supplying the grinding fluid.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
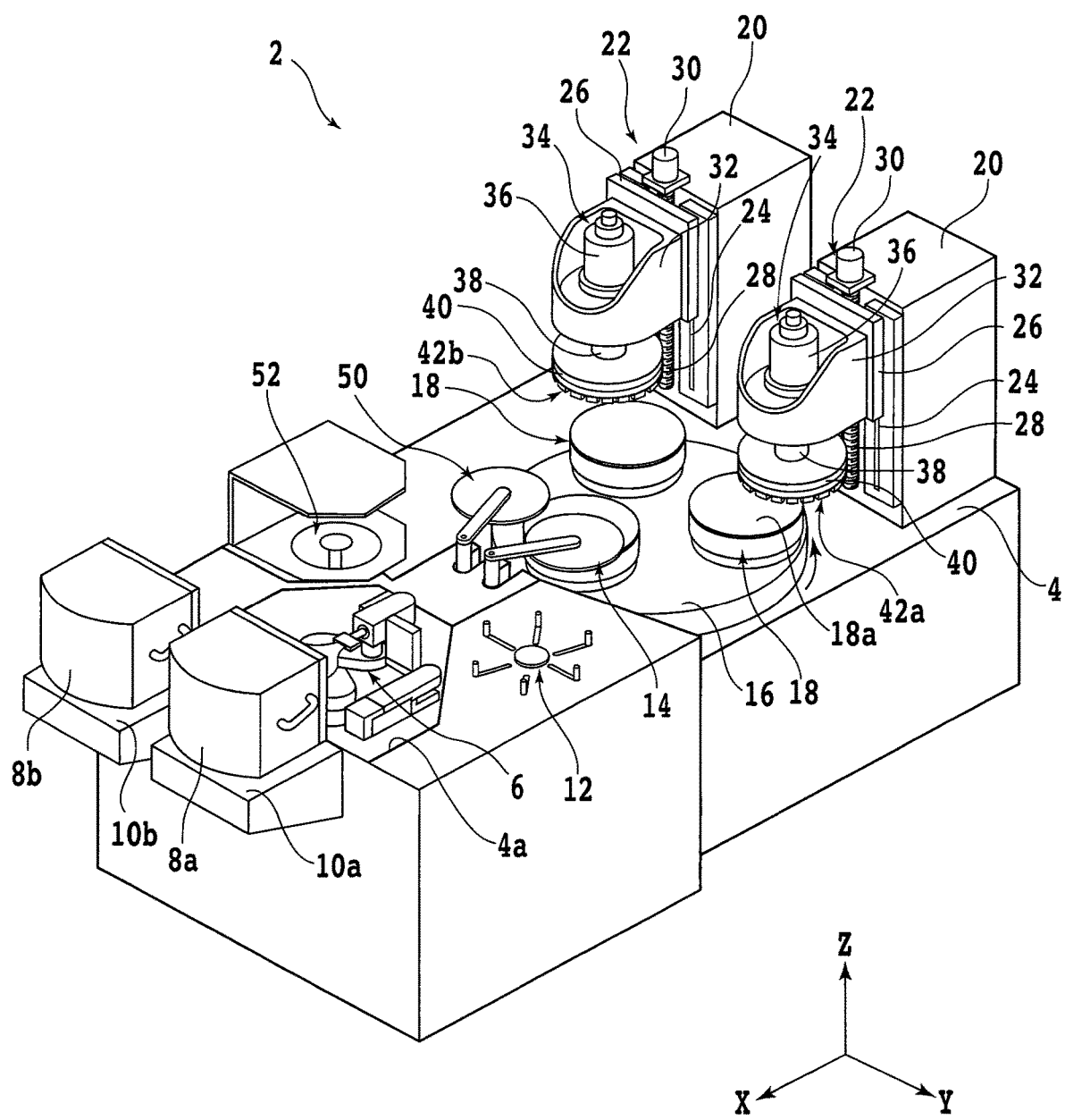
FIG. 1 is a perspective view schematically illustrating a structure of a grinding apparatus, i.e., a processing apparatus, by way of example.

A method of processing a workpiece according to an embodiment of the present invention will be described in detail below with reference to the accompanying drawings. FIG. 1 schematically illustrates, by way of example, a structure of a grinding apparatus, i.e., a processing apparatus, 2 used in the method of processing a workpiece according to the present embodiment. As illustrated in FIG. 1, the grinding apparatus 2 includes a base 4 supporting thereon various components of the grinding apparatus 2. The base 4 has an opening 4a defined in a front end portion of an upper surface thereof. The opening 4a houses therein a feed mechanism 6 for feeding a plate-shaped workpiece (also referred to as "workpiece") 11 (see FIG. 2A, for example).

The grinding apparatus 2 also includes a pair of cassette tables 10a and 10b mounted on the base 4 in front of the opening 4a, for placing thereon respective cassettes 8a and 8b that store a plurality of workpieces 11. A position adjusting mechanism 12 for adjusting the position of a workpiece 11 is disposed on the base 4 obliquely behind the opening 4a. The position adjusting mechanism 12 operates to align the center of a workpiece 11 unloaded from the cassette 8a, for example, by the feed mechanism 6 with a predetermined position.

A loading mechanism 14 for holding and turning a workpiece 11 is disposed on the base 4 in a position adjacent to the position adjusting mechanism 12. The loading mechanism 14 includes a suction pad for attracting an overall upper surface of a workpiece 11 under suction. The loading mechanism 14 delivers a workpiece 11 whose position has been adjusted by the position adjusting mechanism 12, rearwardly away from the position adjusting mechanism 12. A turntable 16 is disposed on the base 4 behind the loading mechanism 14.

The turntable 16 is coupled to a rotary actuator, not illustrated, such as an electric motor, and is rotatable about a rotational axis generally parallel to Z-axis directions, i.e., vertical directions. Supporting on an upper surface of the turntable 16, three chuck tables 18, each for holding a workpiece 11, are spaced at substantially equal angular intervals. However, there is no limitation on the number of chuck tables 18 mounted on the turntable 16.

The loading mechanism 14 loads a workpiece 11 attracted by the suction pad onto one of the chuck tables 18 that is located in a loading/unloading position adjacent to the loading mechanism 14. The turntable 16 intermittently rotates in the direction indicated by an arrow in FIG. 1 to move each of the chuck tables 18 successively to the loading/unloading position, a rough grinding position, i.e., a first processing position, and a finish grinding position, i.e., a second processing position.

Each of the chuck tables 18 is coupled to a rotary actuator, not illustrated, such as an electric motor, and is rotatable about a rotational axis generally parallel to the Z-axis directions. Each of the chuck tables 18 has an upper surface including, as part of it, a holding surface 18a for attracting and holding a workpiece 11 under suction thereon. The holding surface 18a is connected to a suction source, not illustrated, through a flow channel or the like, not illustrated, defined in the chuck table 18. The workpiece 11 that has been loaded on the chuck table 18 has its lower surface attracted under suction to the holding surface 18a by a negative pressure applied from the suction source to the holding surface 18a.

The base 4 supports thereon a pair of columnar support structures 20 disposed respectively behind the rough grinding position and the finish grinding position, i.e., behind the turntable 16. A pair of Z-axis moving mechanisms 22 are mounted on respective front surfaces of the support structures 20. Each of the Z-axis moving mechanisms 22 includes a pair of Z-axis guide rails 24 extending substantially parallel to the Z-axis directions. A Z-axis movable plate 26 is slidably mounted on the Z-axis guide rails 24.

A nut, not illustrated, is mounted on a rear surface, i.e., a reverse side, of each of the Z-axis movable plates 26. The nut is threaded over a Z-axis ball screw 28 extending parallel to and disposed between the Z-axis guide rails 24 of each of the Z-axis moving mechanisms 22. Each of the Z-axis ball screws 28 is coupled to a Z-axis step motor 30. When the Z-axis step motor 30 is energized, it rotates the Z-axis ball screw 28 about its own axis, causing the nut to move the Z-axis movable plate 26 in one of the Z-axis directions along the Z-axis guide rails 24.

A mounting member 32 is disposed on a front surface, i.e., a face side, of each of the Z-axis movable plates 26. A grinding unit, i.e., a processing unit, 34 for grinding, i.e., processing, a workpiece 11 is supported on each of the mounting members 32. The grinding units 34 on the respective mounting members 32 are disposed respectively in the rough grinding position and the finish grinding position. Each of the grinding units 34 includes a spindle housing 36 mounted on the mounting member 32.

A spindle 38 as a rotational shaft that extends generally parallel to the Z-axis directions is rotatably housed in and supported by the spindle housing 36. The spindle 38 has a lower end portion exposed out of a lower end face of the spindle housing 36. A disk-shaped mount 40 is fixed to the exposed lower end portion of the spindle 38.

The mount 40 in the rough grinding position has a lower surface on which a rough grinding wheel 42a is mounted. The mount 40 in the finish grinding position has a lower surface on which a finish grinding wheel 42b is mounted. The rough grinding wheel 42a includes a wheel base 44a (see FIG. 3B) made of a metal material such as stainless steel or aluminum and having a diameter that is essentially the same as the diameter of the mount 40. The rough grinding wheel 42a also includes a plurality of grinding stones 46a (see FIG. 3B) fixed to a lower surface of the wheel base 44a and containing abrasive grains suitable for rough grinding.

Similarly, the finish grinding wheel 42b includes a wheel base 44b (see FIGS. 4A and 4B) made of a metal material such as stainless steel or aluminum and having a diameter that is essentially the same as the diameter of the mount 40. The finish grinding wheel 42b also includes a plurality of grinding stones 46b (see FIGS. 4A and 4B) fixed to a lower surface of the wheel base 44b and containing abrasive grains suitable for finish grinding.

According to the present embodiment, the grain diameter of the abrasive grains contained in the grinding stones 46a for rough grinding is larger than the grain diameter of the abrasive grains contained in the grinding stones 46b for finish grinding. That is, the rough grinding wheel 42a employs the grinding stones 46a that contain abrasive grains suitable for rough grinding which are larger than abrasive grains suitable for finish grinding that are contained in the grinding stones 46b.

The grinding wheels 42a and 42b are positioned directly above, i.e., around, respective grinding fluid supply nozzles 48 (see FIGS. 3B, 4A, and 4B) for supplying a grinding fluid 31 such as pure water to areas, i.e., processing points, where the workpieces 11 and the grinding stones 46a and 46b contact each other. Contact-type or contactless-type thickness measuring units, not illustrated, for measuring the thickness of workpieces 11 being ground are disposed in the vicinity of the grinding wheels 42a and 42b.

According to the present embodiment, the grinding fluid supply nozzles 48 are illustrated as being disposed below or within the respective grinding wheels 42a and 42b. However, the grinding fluid supply nozzles 48 are not limited to any particular layouts, structures, and other details. The areas where the workpieces 11 and the grinding stones 46a and 46b contact each other may be supplied with a grinding fluid from grinding fluid supply nozzles that are disposed outside of the respective grinding wheels 42a and 42b, for example.

Alternatively, for example, supply ports for supplying a grinding fluid may be defined in the respective grinding wheels 42a and 42b as grinding fluid supply nozzles. According to this alternative, a grinding fluid is supplied through the spindles 38 to the supply ports in the respective grinding wheels 42a and 42b.

The workpieces 11 that are held on the respective chuck tables 18 are ground by the two grinding units 34. Specifically, the workpiece 11 that is held on the chuck table 18 that has been moved to and kept in the rough grinding position is ground by the grinding unit 34 in the rough grinding position. The workpiece 11 that is held on the chuck table 18 that has been moved to and kept in the finish grinding position is ground by the grinding unit 34 in the finish grinding position.

An unloading mechanism 50 for holding and turning a workpiece 11 is disposed on the base 4 in a position forward of the loading/unloading position and adjacent to the loading mechanism 14. The unloading mechanism 50 includes a suction pad for attracting an overall upper surface of a workpiece 11 under suction. The unloading mechanism 50 unloads a workpiece 11 that has been ground from the chuck table 18 that has been moved to and kept in the loading/unloading position, and delivers the unloaded workpiece 11 forwardly away from the loading/unloading position.

A cleaning mechanism 52 is disposed on the base 4 in a position adjacent to the unloading mechanism 50, for cleaning the ground workpiece 11 delivered by the unloading mechanism 50. The workpiece 11 delivered to the cleaning mechanism 52 is cleaned by the cleaning mechanism 52, and is then delivered by the feed mechanism 6 into the cassette 8b, for example. The grinding apparatus 2 includes a control unit, not illustrated, electrically connected to the components described above of the grinding apparatus 2. The control unit controls operation of the above components to appropriately grind workpieces 11.

Figure 2A:
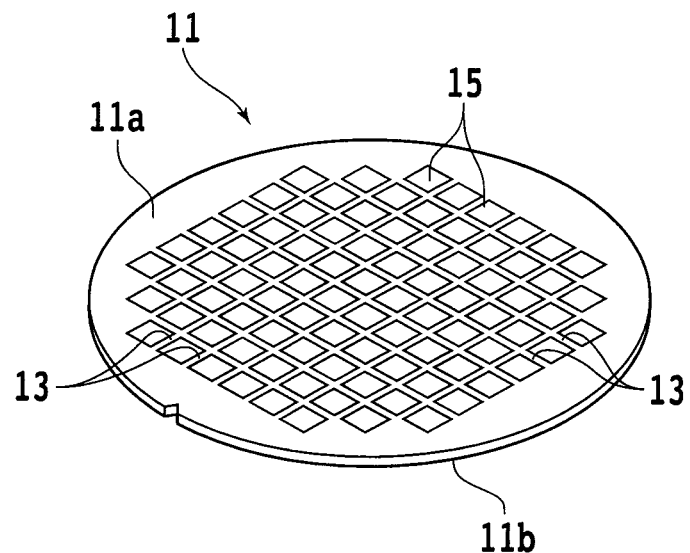
FIG. 2A is a perspective view schematically illustrating a structure of a workpiece by way of example.

Next, the method of processing a workpiece according to the present embodiment using the grinding apparatus 2 will be described in detail below. FIG. 2A schematically illustrates in perspective a structure of a workpiece 11 by way of example, which is to be processed by the method of processing a workpiece according to the present embodiment. The workpiece 11 is in the form of a disk-shaped wafer made of a semiconductor material such as silicon (Si), for example. The workpiece 11 has a face side 11a demarcated into a plurality of areas by a plurality of intersecting projected dicing lines or streets 13. Devices 15 such as integrated circuits (ICs) are formed respectively in the areas of the face side 11a.

According to the present embodiment, a disk-shaped wafer made of a semiconductor material such as silicon (Si) is used as the workpiece 11. However, the workpiece 11 is not limited to any particular materials, shapes, structures, sizes, etc. A substrate made of any of various materials including semiconductors, ceramics, resins, and metals, for example, may be used as the workpiece 11. Similarly, the devices 15 are not limited to any particular kinds, quantities, shapes, structures, sizes, layouts, etc. The workpiece 11 may be free of the devices 15.

Figure 2B:
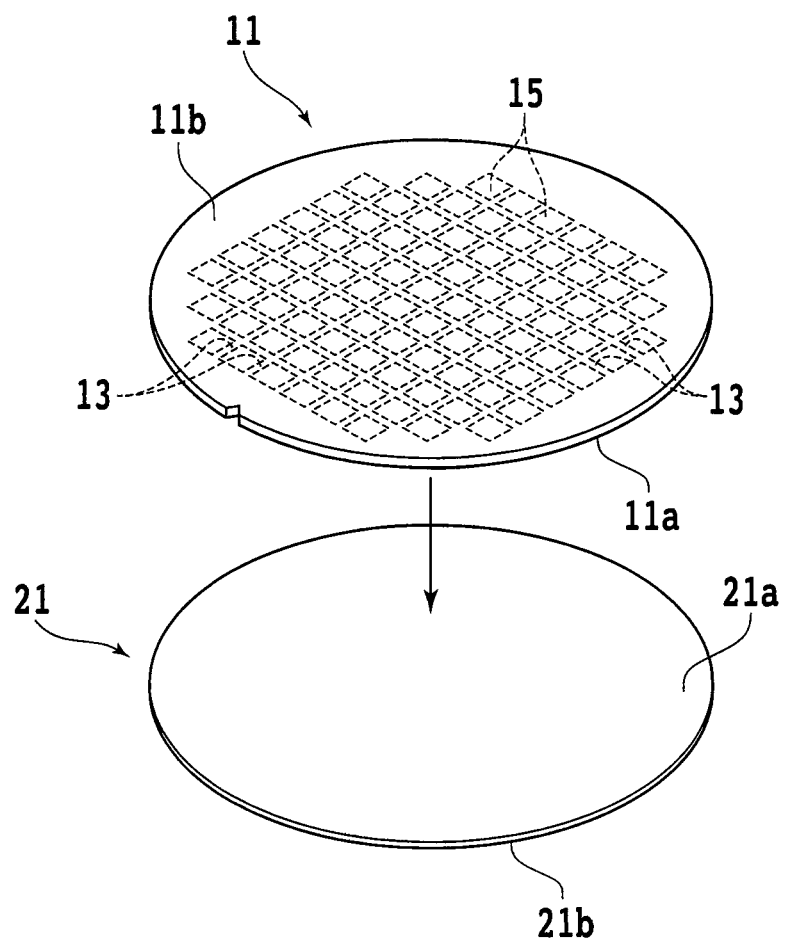
FIG. 2B is a perspective view illustrating a protective member sticking step.

In the method of processing a workpiece according to the present embodiment, a protective member sticking step is initially performed to stick or apply a protective member to the face side 11a of the workpiece 11. FIG. 2B illustrates in perspective the protective member sticking step. A protective member, denoted by 21, is a circular tape or film, a circular resin substrate, a circular wafer or substrate of a type that is identical to or different from the workpiece 11, or the like, which is of a diameter generally equal to that of the workpiece 11. The protective member 21 has a face side 21a coated with a glue layer having adhesive power.

Therefore, when the face side 21a of the protective member 11 is brought into close contact with the face side 11a of the workpiece 11, as illustrated in FIG. 2B, the protective member 21 is stuck to the workpiece 11. The protective member 21 stuck to the face side 11a of the workpiece 11 protects the devices 15, etc. on the face side 11a by dampening shocks that are applied to the workpiece 11 in each of various subsequent steps of the method. The workpiece 11 with the protective member 21 stuck thereto is stored in the cassette 8a, for example.

Figure 3A:
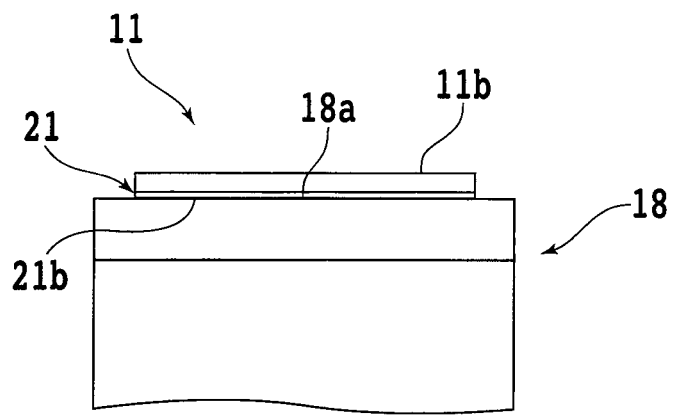
FIG. 3A is a side elevational view illustrating a holding step.

After the protective member sticking step, a holding step is carried out to hold the workpiece 11 on the holding surface 18a of one of the chuck table 18. FIG. 3A illustrates the holding step in side elevation. In the holding step, the workpiece 11 with the protective member 21 stuck thereto is held on the chuck table 18 disposed in the loading/unloading position.

Specifically, the feed mechanism 6 unloads the workpiece 11 from the cassette 8a. The workpiece 11 unloaded from the cassette 8a is aligned with the predetermined position by the position adjusting mechanism 12. Then, the loading mechanism 14 places the workpiece 11 onto the chuck table 18 disposed in the loading/unloading position. When the workpiece 11 is placed onto the chuck table 18, a reverse side 21b of the protective member 21 stuck to the workpiece 11 is first held in contact with the holding surface 18a of the chuck table 18, as illustrated in FIG. 3A.

Then, a negative pressure from the suction source is allowed to act on the holding surface 18a. The workpiece 11 is now held on the chuck table 18 with the protective member 21 interposed therebetween while the reverse side 11b of the workpiece 11, which is opposite the face side 11a thereof, is being exposed upwardly. According to the present embodiment, therefore, when the workpiece 11 is held on the chuck table 18, the reverse side 11b of the workpiece 11 faces upwardly as an upper surface, i.e., a surface to be ground, and the face side 11a thereof faces downwardly as a lower surface.

Figure 3B:
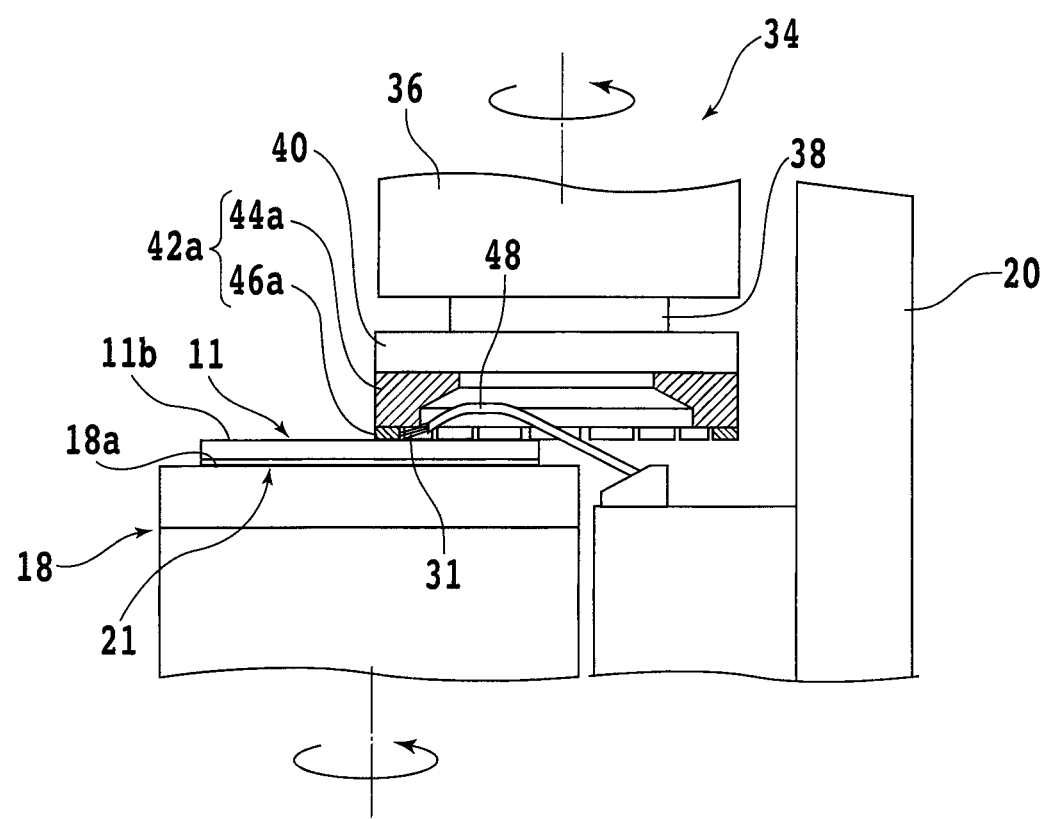
FIG. 3B is a side elevational view, partly in cross section, illustrating a rough grinding step.

The holding step is followed by a grinding step for grinding the reverse side 11b to thin the workpiece 11. The grinding step according to the present embodiment includes a rough grinding step for roughly grinding the workpiece 11 and a finish grinding step to be performed after the rough grinding step. FIG. 3B illustrates the rough grinding step in side elevation, partly in cross section.

In the rough grinding step, the turntable 16 is turned to move the chuck table 18 from the loading/unloading position to the rough grinding position where the workpiece 11 is positioned beneath the rough grinding wheel 42a. Then, as illustrated in FIG. 3B, the chuck table 18 and the rough grinding wheel 42a are rotated about their own axes, and the spindle housing 36 in the rough grinding position is lowered to press the grinding stones 46a of the rough grinding wheel 42a against the reverse side 11b of the workpiece 11 while the grinding fluid 31 is being supplied from the grinding fluid supply nozzle 48 in the rough grinding position to the workpiece 11.

While the grinding fluid 31 is being supplied from the grinding fluid supply nozzle 48 in the rough grinding position to the area, i.e., the processing point, where the workpieces 11 and the grinding stones 46a contact each other, the spindle housing 36 in the rough grinding position is continuously lowered to cause the grinding stones 46a to roughly grind the reverse side 11b of the workpiece 11, thinning the workpiece 11.

Conditions including the speed at which the spindle housing 36 is lowered, the rate at which the grinding fluid 31 is supplied from the grinding fluid supply nozzle 48, and so on are appropriately adjusted within a range in which the workpiece 11 can be ground without loading the grinding stones 46a with chip accumulated around the abrasive grains of the grinding stones 46a. The rough grinding step is continued until the workpiece 11 is ground to a predetermined thickness, i.e., a first thickness.

Figure 4A:
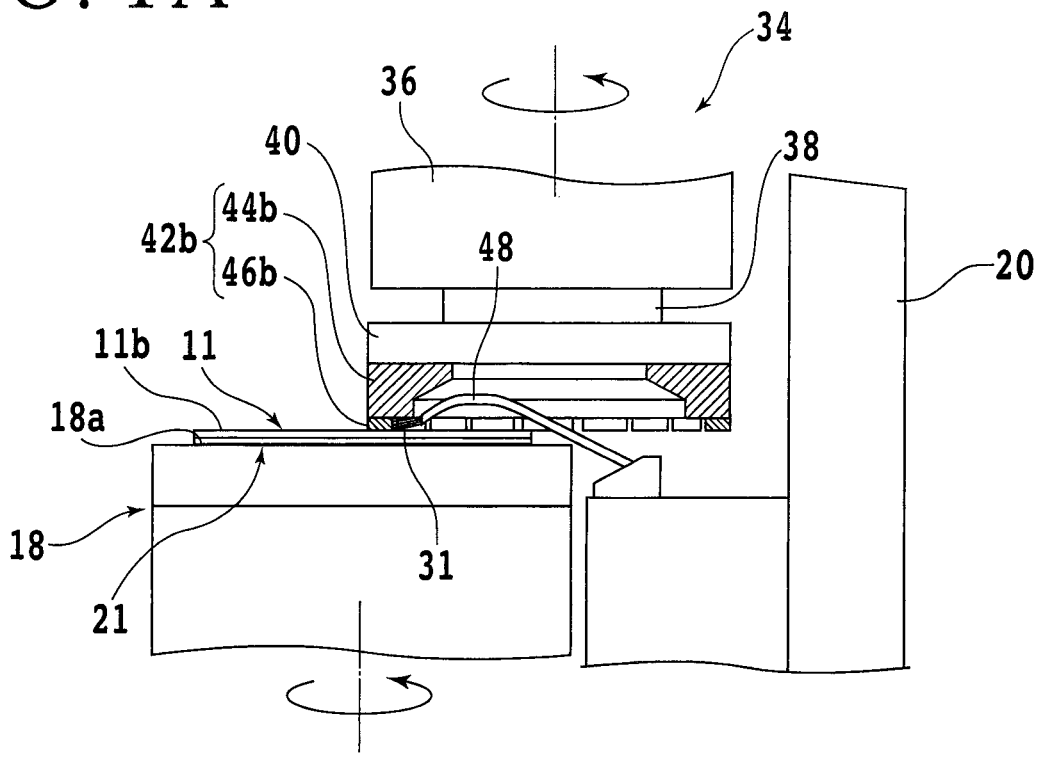
FIG. 4A is a side elevational view, partly in cross section, illustrating a finish grinding step.

The rough grinding step is followed by the finish grindings step. FIG. 4A illustrates the finish grinding step in side elevation, partly in cross section. In the finish grinding step, the turntable 16 is turned to move the chuck table 18 from the rough grinding position to the finish grinding position where the roughly ground workpiece 11 is positioned beneath the finish grinding wheel 42b.

Then, as illustrated in FIG. 4A, the chuck table 18 and the finish grinding wheel 42b are rotated about their own axes, and the spindle housing 36 in the finish grinding position is lowered to press the grinding stones 46b of the finish grinding wheel 42b against the reverse side 11b of the workpiece 11 while the grinding fluid 31 is being supplied from the grinding fluid supply nozzle 48 in the finish grinding position to the workpiece 11. While the grinding fluid 31 is being supplied from the grinding fluid supply nozzle 48 in the finish grinding position to the area, i.e., the processing point, where the workpieces 11 and the grinding stones 46b contact each other, the spindle housing 36 in the finish grinding position is continuously lowered to cause the grinding stones 46b to finishingly grind the reverse side 11b of the workpiece 11, further thinning the workpiece 11.

Conditions including the speed at which the spindle housing 36 is lowered, the rate at which the grinding fluid 31 is supplied from the grinding fluid supply nozzle 48, and so on are appropriately adjusted within a range in which the workpiece 11 can be ground without loading the grinding stones 46b with chip accumulated around the abrasive grains of the grinding stones 46b. The finish grinding step is continued until the workpiece 11 is ground to a predetermined thickness, i.e., a second thickness.

According to the present embodiment, since the workpiece 11 is ground in the two steps, i.e., the rough grinding step and the finish grinding step, it is easier to achieve both the planarity of the reverse side 11b and the processing efficiency at higher levels than if the workpiece 11 were ground in one step. According to the present invention, the grinding step may alternatively include one step or three or more steps.

Figure 4B:
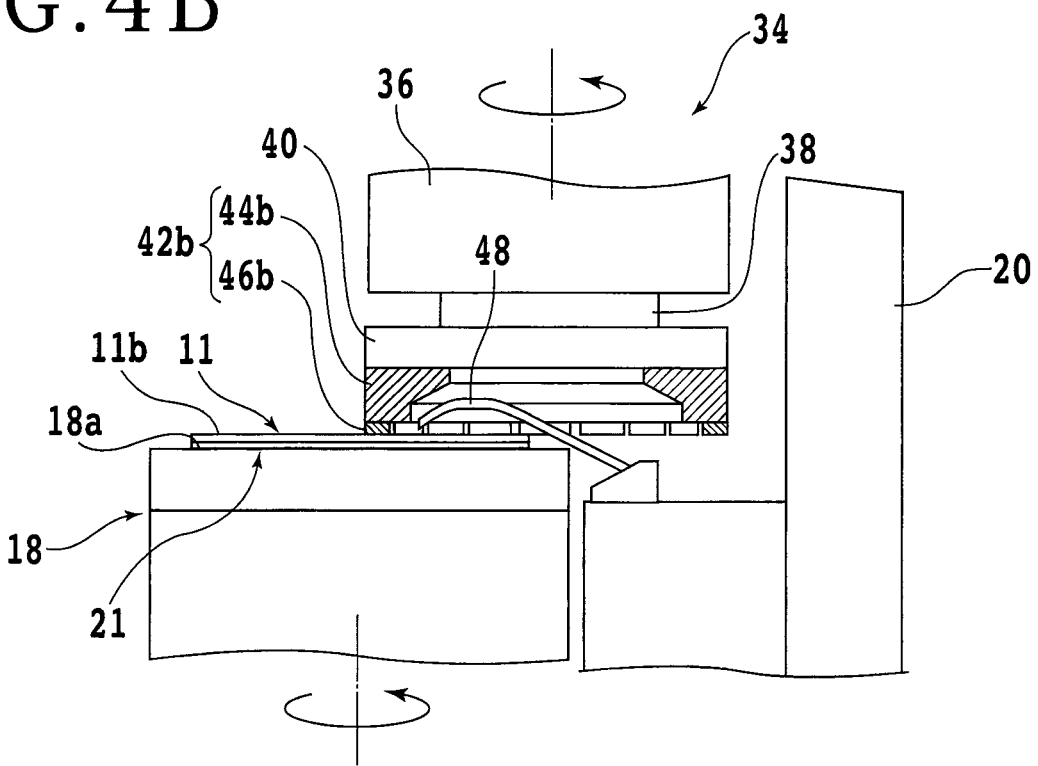
FIG. 4B is a side elevational view, partly in cross section, illustrating a treating step.

After the grinding step, i.e., the finish grinding step, a treating step is performed to further treat the workpiece 11. FIG. 4B illustrates the treating step in side elevation, partly in cross section. The treating step is carried out in a similar manner to the finish grinding step. In the treating step, however, no grinding fluid is supplied from the grinding fluid supply nozzle 48.

Specifically, while the supply of the grinding fluid 31 from the grinding fluid supply nozzle 48 in the finish grinding position is being stopped, the chuck table 18 in the finish grinding position and the finish grinding wheel 42b are rotated about their own axes, and the spindle housing 36 in the finish grinding position is lowered at such a speed that the lower surfaces of the grinding stones 46b are pressed against the reverse side 11b of the workpiece 11 under an appropriate load.

When the lower surfaces of the grinding stones 46b are pressed against the reverse side 11b of the workpiece 11 while the supply of the grinding fluid 31 from the grinding fluid supply nozzle 48 in the finish grinding position is being stopped, the grinding stones 46b are loaded with chip accumulated around the abrasive grains of the grinding stones 46b. When the grinding stones 46b are loaded, the grinding process hardly makes progress, and the workpiece 11 starts being polished by the loaded grinding stones 46b.

In the treating step, therefore, the planarity of the reverse side 11b of the workpiece 11 increases. Specifically, saw marks produced on the reverse side 11b in the finish grinding step are reduced, and crushed areas, i.e., crushed layers, produced by the grinding stones 46b in the finish grinding step are also reduced. When the workpiece 11 is sufficiently polished, the treating step is finished.

When the finish grinding step is to be performed on a next workpiece 11, since the grinding fluid 31 is supplied again from the grinding fluid supply nozzle 48, the grinding stones 46b that has been loaded in the treating step are unloaded by a process known as an autogeneous cutting edge generating process. In other words, the treating step does not adversely affect the next finish grinding step.

In the method of processing a workpiece according to the present embodiment, as described above, the grinding step for grinding the reverse side 11b of the workpiece 11 while supplying the grinding fluid 31 to the workpiece 11 is followed by the treating step for bringing the grinding stones 46b into contact with the reverse side 11b of the workpiece 11 while stopping supplying the grinding fluid 31 to the workpiece 11. In the treating step, since the grinding stones 46b are brought into contact with the reverse side 11b of the workpiece 11 while stopping supplying the grinding fluid 31 to the workpiece 11, the reverse side 11b of the workpiece 11 is polished by the loaded grinding stones 46b.

In the method of processing a workpiece according to the present embodiment, inasmuch as the reverse side 11b of the workpiece 11 is polished simply by bringing the grinding stones 46b into contact with the reverse side 11b of the workpiece 11 while stopping supplying the grinding fluid 31 to the workpiece 11, the workpiece 11 can be processed more efficiently than if the workpiece 11 were polished using another apparatus, for example.

The present invention is not limited to the embodiment described above, but various changes and modifications may be made in the illustrated embodiment. For example, the grinding step, i.e., the finish grinding step, and the treating step may be performed continuously in succession without stopping the chuck table 18 and the finish grinding wheel 42b from rotating. Specifically, the grinding step, i.e., the finish grinding step may change to the treating step simply by stopping supplying the grinding fluid 31 from the grinding fluid supply nozzle 48.

According to the present embodiment, the finish grinding step is carried out under conditions in which the grinding stones 46b are less liable to be loaded, and thereafter the grinding stones 46b are loaded while stopping supplying the grinding fluid 31 from the grinding fluid supply nozzle 48 in the subsequent treating step. The method of processing a workpiece according to the present invention is also applicable to a situation where the finish grinding step is carried out under conditions in which the abrasive grains of the grinding stones 46b are worn and rendered dull, resulting in a reduction in grinding performance. The abrasive grains of the grinding stones 46b tend to become dull if the spindle housing 36 is lowered at a higher speed, imposing a larger load on the grinding stones 46b.

In a case where the finish grinding step is performed under conditions in which the abrasive grains of the grinding stones 46b tend to become dull, the grinding stones 46b can be dressed by stopping supplying the grinding fluid 31 from the grinding fluid supply nozzle 48 in the subsequent treating step. According to such a modification, the performance of the grinding stones 46b can be recovered in the treating step. It is considered that chip produced while no grinding fluid 31 is being supplied from the grinding fluid supply nozzle 48 contributes to the dressing of the grinding stones 46b.

In the method of processing a workpiece according to the modification, since the grinding stones 46b are dressed simply by stopping supplying the grinding fluid 31 and bringing the grinding stones 46b into contact with the reverse side 11b of the workpiece 11, the workpiece 11 can be processed more efficiently than if the grinding stones 46b were dressed by a dressing board set in place of the workpiece 11.

The structural details, the details of the method, and other details according to the above embodiment and modifications may be changed or modified without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a plate-shaped workpiece, comprising the steps of:
   sticking a protective member to a face side of the workpiece;
   holding the face side of the workpiece on a holding surface of a chuck table with the protective member interposed therebetween, such that a reverse side of the workpiece which is opposite the face side thereof is exposed;
   grinding the reverse side of the workpiece held on the chuck table to thin the workpiece by rotating a grinding wheel including grinding stones that contain abrasive grains and bringing the grinding stones into contact with the reverse side of the workpiece, while a grinding fluid is being supplied from a grinding fluid supply nozzle to the reverse side of the workpiece; and
   after the step of grinding the reverse side of the workpiece, treating the workpiece or the grinding stones by rotating the grinding wheel and bringing the grinding stones into contact with the reverse side of the workpiece, while stopping supplying the grinding fluid from the grinding fluid supply nozzle, wherein during the step of treating the workpiece or the grinding stones, the grinding stones are loaded with chips from the workpiece that have accumulated around the abrasive grains during the step of grinding the reverse side of the workpiece.

2. The method of processing a plate-shaped workpiece according to claim 1, wherein:
   planarity of the reverse side of the workpiece is increased in the step of treating the workpiece or the grinding stones.

3. The method of processing a plate-shaped workpiece according to claim 2, further comprising the step of:
   before the step of grinding the reverse side of the workpiece, roughly grinding the reverse side of the workpiece using rough grinding stones containing abrasive grains larger than the abrasive grains contained in the grinding stones.

4. The method of processing a plate-shaped workpiece according to claim 3, wherein:
   during the step of grinding the reverse side of the workpiece, crushed layers are produced on the reverse side of the workpiece; and
   during the step of treating the workpiece or the grinding stones, the crushed layers are reduced.

5. The method of processing a plate-shaped workpiece according to claim 1, wherein:
   performance of the grinding stones is recovered in the step of treating the workpiece or the grinding stones.

6. The method of processing a plate-shaped workpiece according to claim 5, further comprising the step of:
   before the step of grinding the reverse side of the workpiece, roughly grinding the reverse side of the workpiece using rough grinding stones containing abrasive grains larger than the abrasive grains contained in the grinding stones.

7. The method of processing a plate-shaped workpiece according to claim 6, wherein:
   during the step of grinding the reverse side of the workpiece, crushed layers are produced on the reverse side of the workpiece; and
   during the step of treating the workpiece or the grinding stones, the crushed layers are reduced.

8. The method of processing a plate-shaped workpiece according to claim 1, further comprising the step of:
   before the step of grinding the reverse side of the workpiece, roughly grinding the reverse side of the workpiece using rough grinding stones containing abrasive grains larger than the abrasive grains contained in the grinding stones.

9. The method of processing a plate-shaped workpiece according to claim 8, wherein:
   during the step of grinding the reverse side of the workpiece, crushed layers are produced on the reverse side of the workpiece; and
   during the step of treating the workpiece or the grinding stones, the crushed layers are reduced.

10. A method of processing a plate-shaped workpiece, comprising the steps of:
    sticking a protective member to a face side of the workpiece;
    holding the face side of the workpiece on a holding surface of a chuck table with the protective member interposed therebetween, such that a reverse side of the workpiece which is opposite the face side thereof is exposed;
    grinding the reverse side of the workpiece held on the chuck table to thin the workpiece by rotating a grinding wheel including grinding stones that contain abrasive grains and bringing the grinding stones into contact with the reverse side of the workpiece, while a grinding fluid is being supplied from a grinding fluid supply nozzle to the reverse side of the workpiece; and
    after the step of grinding the reverse side of the workpiece, treating the workpiece or the grinding stones by rotating the grinding wheel and bringing the grinding stones into contact with the reverse side of the workpiece, while stopping supplying the grinding fluid from the grinding fluid supply nozzle, wherein at some point in time during the step of treating the workpiece or the grinding stones, the grinding stones are loaded with chips from the workpiece that have accumulated around the abrasive grains during an earlier point in time during the step of treating the workpiece or the grinding stones.

11. The method of processing a plate-shaped workpiece according to claim 10, wherein:

planarity of the reverse side of the workpiece is increased in the step of treating the workpiece or the grinding stones.

12. The method of processing a plate-shaped workpiece according to claim 11, further comprising the step of:

before the step of grinding the reverse side of the workpiece, roughly grinding the reverse side of the workpiece using rough grinding stones containing abrasive grains larger than the abrasive grains contained in the grinding stones.

13. The method of processing a plate-shaped workpiece according to claim 12, wherein:

during the step of grinding the reverse side of the workpiece, crushed layers are produced on the reverse side of the workpiece; and during the step of treating the workpiece or the grinding stones, the crushed layers are reduced.

14. The method of processing a plate-shaped workpiece according to claim 10, wherein:

performance of the grinding stones is recovered in the step of treating the workpiece or the grinding stones.

15. The method of processing a plate-shaped workpiece according to claim 14, further comprising the step of:

before the step of grinding the reverse side of the workpiece, roughly grinding the reverse side of the workpiece using rough grinding stones containing abrasive grains larger than the abrasive grains contained in the grinding stones.

16. The method of processing a plate-shaped workpiece according to claim 15, wherein:

during the step of grinding the reverse side of the workpiece, crushed layers are produced on the reverse side of the workpiece; and during the step of treating the workpiece or the grinding stones, the crushed layers are reduced.

17. The method of processing a plate-shaped workpiece according to claim 10, further comprising the step of:

before the step of grinding the reverse side of the workpiece, roughly grinding the reverse side of the workpiece using rough grinding stones containing abrasive grains larger than the abrasive grains contained in the grinding stones.

18. The method of processing a plate-shaped workpiece according to claim 17, wherein:

during the step of grinding the reverse side of the workpiece, crushed layers are produced on the reverse side of the workpiece; and during the step of treating the workpiece or the grinding stones, the crushed layers are reduced.

* * * * *